(12) United States Patent
Rowell et al.

(10) Patent No.: US 10,573,974 B2
(45) Date of Patent: Feb. 25, 2020

(54) ANTENNA ARRAY, CALIBRATION SYSTEM AS WELL AS METHOD FOR CALIBRATING AN ANTENNA ARRAY

(71) Applicant: Rohde & Schwarz GmbH & Co. KG, Munich (DE)

(72) Inventors: Corbett Rowell, Munich (DE); Adam Tankielun, Ottobrunn (DE); Hendrik Bartko, Unterhaching (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 209 days.

(21) Appl. No.: 15/644,514

(22) Filed: Jul. 7, 2017

(65) Prior Publication Data

US 2019/0013590 A1    Jan. 10, 2019

(51) Int. Cl.

| H01Q 1/48 | (2006.01) |
| H01Q 21/06 | (2006.01) |
| G01R 29/10 | (2006.01) |
| H01Q 19/00 | (2006.01) |
| H01Q 3/26 | (2006.01) |
| G01R 35/00 | (2006.01) |

(52) U.S. Cl.
CPC ........... *H01Q 21/061* (2013.01); *G01R 29/10* (2013.01); *H01Q 1/48* (2013.01); *H01Q 3/267* (2013.01); *H01Q 19/005* (2013.01); *G01R 35/005* (2013.01)

(58) Field of Classification Search
CPC ..... H01Q 21/061; H01Q 3/267; H01Q 10/005
See application file for complete search history.

(56) References Cited

U.S. PATENT DOCUMENTS 9,196,959 B1    11/2015    Doane et al.

OTHER PUBLICATIONS

On the Use of Dummy Elements to Match Edge Elements in Transmit Arrays, Eric Holzman, 2013 IEEE, pp. 549-552.*

* cited by examiner

*Primary Examiner* — Graham P Smith
(74) *Attorney, Agent, or Firm* — Christensen O'Connor Johnson Kindness PLLC

(57) ABSTRACT

An antenna array has plurality of active antennas and passive antennas, wherein the passive antennas being arranged such that the radiation patterns of the active antennas adjacent to the passive antennas match the radiation pattern of the active antennas adjacent only to other active antennas. Further, a calibration system and a method for calibrating an antenna array are shown.

20 Claims, 2 Drawing Sheets

ANTENNA ARRAY, CALIBRATION SYSTEM AS WELL AS METHOD FOR CALIBRATING AN ANTENNA ARRAY

FIELD OF THE DISCLOSURE

Embodiments of the present disclosure relate generally to an antenna array, a calibration system as well as a method for calibrating an antenna array.

BACKGROUND

In an antenna array several single antennas are grouped together to form a known pattern. Using a control unit connected to each of the individual antennas, the amplitude and the phase of the electromagnetic waves emitted by each antenna can be controlled in a way that the electromagnetic waves interfere with each other creating a planar wave with a defined propagation direction and desired properties. Such antenna arrays are also called plane wave converters (PWC) or phased arrays.

In order to ensure a precise control of the radiation of the antenna array, each antenna has to be calibrated with respect to its phase and amplitude, and a phase weighting calculation has to be performed for generation of a planar wave having the properties intended.

For calibration of known antenna arrays, the radiation pattern for each of the antennas has to be determined with a moveable measurement antenna in the near field for measuring the radiation pattern of each antenna. Alternatively, multiple stationary probes or measurement antennas are positioned in the far field for calibration purposes. The number of stationary probes has to equal the number of antennas in the array.

Therefore, calibrating an antenna array necessitates complex measurement equipment. In addition, calibration is time consuming under currently known methods.

SUMMARY

Thus, there is a need for an antenna array that can be calibrated in a simpler fashion and faster, a calibration system performing a calibration and a simpler as well as faster method for calibrating an antenna array.

Embodiments of the present disclosure aim to address this need, among others. In that regard, representative embodiments of the present disclosure provide an antenna array with a plurality of active antennas and a plurality of passive antennas. The plurality of active antennas is arranged in an inner portion of the antenna array, and each antenna of the plurality of active antennas have a radiation pattern. The passive antennas are arranged such that the radiation patterns of the active antennas located at the periphery of the inner portion are altered by the passive antennas to match the radiation patterns of the active antennas located in the center of the inner portion.

The active antennas are phase and amplitude controlled and are used for sending and receiving electromagnetic signals. In contrast thereto, the passive antennas cannot send or receive electromagnetic signals, meaning that they are not connected to any control unit that could perform the transmission or reception of signals using the passive antennas. The antenna array may be a plane wave converter (PWC).

For example, the passive antennas are located in the outer portion only and the outer portion may completely surround the inner portion comprising the active antennas. The inner and the outer portions are defined with respect to a front view onto the antenna array, and in some embodiments, a view onto its active side.

Further, the disclosure provides a calibration system comprising a single stationary measurement antenna and an antenna array according to the above aspect of the disclosure. The single stationary measurement antenna is configured to receive signals emitted by at least one of the active antennas of the antenna array.

In addition, the disclosure provides a method for calibrating an antenna array as described above comprising the following steps:
 a) determining the radiation pattern of one of the plurality of active antennas,
 b) placing a stationary measurement antenna in front of the antenna array and measuring the signal emitted by a single active antenna driven by a control unit of the antenna array, and
 c) performing calibration using the signal measured by the measurement antenna and assuming that the radiation pattern of all active antennas of the plurality of active antennas corresponds to the radiation pattern determined in step b).

The radiation pattern is determined, e.g. measured or computed, at least for the angular range being used during operation of the antenna array or completely, for instance in an angular range of 180°. The phases and the relative amplitudes of the electromagnetic signals emitted by the active antennas in relation to each other are set appropriately while performing calibration.

In some embodiments, during step b) described above, for example, only one of the plurality of active antennas of the antenna array transmits a signal at a time while the other active antennas are turned off, for instance being driven appropriately by the control unit of the antenna array.

The calibration of the antenna array is drastically simplified by the fact that the radiation patterns for the active antennas located in the center portion and the radiation patterns of the active antennas located in the periphery of the inner portion are the same. Thus, once the radiation pattern for one of the active antennas is determined, e.g. measured or computed, the radiation pattern for the other active antennas is known as well. Therefore, it is possible to determine any offset in phase or amplitude of each of the active antennas using a stationary measurement antenna at a well-known point in front of the antenna array. Then, phase weighting calculations as well as adjustments to the phase and amplitude of each of the active antennas can be performed. The time required for calibration is also reduced drastically.

Thus, the calibration system and the method for calibrating the antenna array can be simplified because only one stationary measurement antenna is needed for the whole calibration of the antenna array.

In an aspect of the disclosure, the plurality of passive antennas is arranged in an outer portion of the antenna array such that the radiation patterns are the same for each active antenna. The outer portion may be surrounding the inner portion, and in some embodiments, completely surrounding the inner portion. In this way, each antenna has the same radiation pattern that can easily be used for calibrating the antenna array.

For example, the active antennas are electrically connected to a control unit. The control unit may be a single device for all antennas or a plurality of devices, for example, one device for each antenna. Each active antenna can therefore be controlled independently. Performing a phased array, the control unit controls at least one of the phase and the amplitude of the signals emitted for each of the active antennas individually.

In another aspect, the passive antennas are grounded in order to effectively influence the radiation pattern of the active antennas.

For a precise influence on the radiation pattern, the passive antennas have a defined impedance. The impedance may be 50Ω or 75Ω in some embodiments. This impedance value corresponds to the impedance value of an antenna that is controlled to act as a parasitic antenna, namely being actively switched off.

In an embodiment of the disclosure, the active antennas are arranged in a regular pattern such that each active antenna has a defined number of neighboring antennas being the number of neighboring active antennas and passive antennas. The passive antennas are arranged such that the numbers of neighboring antennas of the active antennas located at the periphery of the inner portion are increased by the passive antennas to match the numbers of neighboring antennas of active antennas located in the center of the inner portion. It has been found that the number of neighboring antennas influences the radiation pattern of each antenna so that equalizing the number of neighboring antennas leads to the same radiation patterns for the individual antennas.

The plurality of passive antennas may be arranged in some embodiments such that the number of neighboring antennas is the same for each active antenna so that the radiation patterns of all active antennas are the same.

In another aspect, the active antennas are arranged in a regular pattern such that a distance between one of the active antennas and a neighboring passive antenna is the same as a distance between the one of the active antennas and a neighboring active antenna. This setup leads to closely matching radiation patterns of all active antennas.

For example, the antennas are arranged in a rectangular grid. The rectangular grid may be a quadratic grid. This way, uniformity of the radiation patterns can be improved further. Accordingly, the overall radiation pattern of the antenna array can be controlled to be homogenous easily.

The regular pattern may be defined by antennas being arranged in columns and rows in a front view onto the antenna array. The columns and rows may comprise active and passive antennas. Particularly, the first and last column as well as the first and last row may solely comprise passive antennas.

In another aspect of the disclosure, all active antennas have the same number of neighboring antennas and the same distance to each of their respective neighboring antennas so that the radiation patterns of all active antennas are precisely the same.

In an embodiment, neighboring antennas to one of the plurality of active antennas include one of the antennas closest to the one antenna; the antennas closest and second closest to the one antenna; the antennas closest, second closest, and third closest to the one antenna; and the antennas closest, second closest, third closest, and fourth closest to the one antenna. By increasing the numbers of antennas regarded as neighboring antennas, the uniformity of the radiation patterns can be further improved.

The passive antennas in some embodiments may be arranged in at least one ring around the inner portion to easily provide and arrange the passive antennas around the active antennas.

For example, the passive antennas are arranged in at least a first ring and a second ring around the inner portion in order to take into account the influence of the next neighbors and of the one after next neighbors.

In an embodiment of the disclosure the passive antennas are at least one of dimensioned differently with respect to the active antennas and located at different distances to the active antennas located at the periphery of the inner portion compared to the distances between the active antennas. This way, the amount of passive antennas needed may be reduced. However, the influences of antennas being no direct neighbors are also taken into account appropriately.

In another aspect of the disclosure, steps b) and c) described above are repeated for every active antenna of the antenna array in order to calibrate each antenna separately. However, it is not necessary to determine the radiation pattern of the further active antennas as it is assumed that the radiation pattern corresponds to the one measured in step a) described above of the first active antenna. Accordingly, the calibration time is reduced as the radiation pattern has to be determined only once.

The active antennas in some embodiments may be calibrated during step c) described above such that the desired radiation pattern of the antenna array is achieved so that simple calibration and precise results are obtained.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawing, wherein

DETAILED DESCRIPTION

The detailed description set forth below in connection with the appended drawing, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
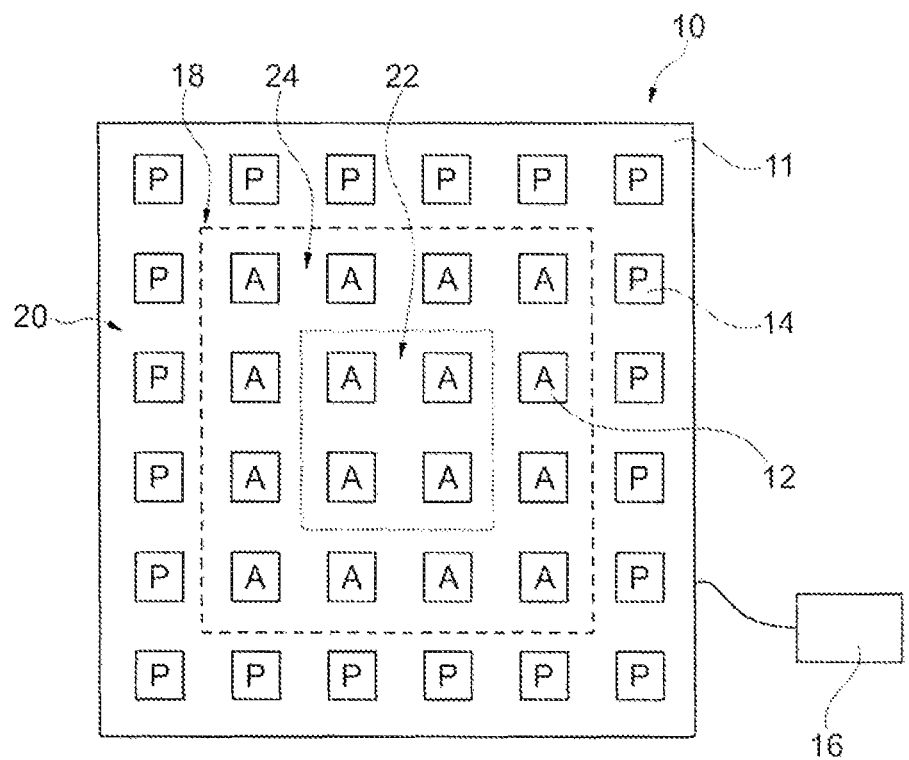
FIG. 1 shows an antenna array according to a first embodiment of the disclosure schematically in a front view.

FIG. 1 shows an antenna array 10 in a front view, i.e. in a view onto the active side of the antenna array 10. The antenna array 10 may be a plane wave converter.

The antenna array 10 comprises a plurality of active antennas 12 and passive antennas 14. In the FIGURES, active antennas 12 and passive antennas 14 are labeled with an "A" and "P", respectively. The antenna array 10 may be provided on a substrate 11 and the active antennas 12 and passive antennas 14 may be created by separate conductive areas, squares for example. The shape of the active antennas 12 and the passive antennas 14 are the same for all antennas 12, 14.

The active antennas 12 are electrically connected to a control unit 16. The control unit 16 may be a single device for all active antennas 12, as shown in FIG. 1. Of course, it is also possible that each active antenna 12 may have its own dedicated control unit or that several active antennas 12 share one common control unit.

The control unit 16 is configured to control the phase and the amplitude of the (electromagnetic) signals emitted by each of the active antennas 12 individually. As such, a relation between the phases and the amplitudes of the signals emitted by each of the active antennas 12 can be created by the control unit 16 or the several control units in order to create a plane wave with a defined propagation direction and properties intended. Thus, the antenna array 10 is a phased array.

Each of the active antennas 12 has a radiation pattern depending on their shape and the surrounding of the respective antenna 12, especially neighboring antennas 12, 14.

The passive antennas 14 are grounded and are provided with a defined impedance, for example 50Ω or 75Ω. The passive antennas 14 cannot be used to send or receive signals as they are not connected to the control unit 16. Thus, these passive antennas 14 cannot be controlled to be active antennas.

In the embodiment shown in FIG. 1, the antenna array 10 comprises 36 antennas in total, 16 of which are active antennas 12 and 20 of which are passive antennas 14. The number and arrangement of the antennas 12, 14 is just an example and can, of course, vary.

As can be seen in FIG. 1, the active antennas 12 and the passive antennas 14 are arranged in a regular pattern. In the regular pattern, the antennas 12, 14 are arranged in columns and rows in the front view onto the antenna array 10 as shown in FIG. 1. In the shown embodiment, the regular pattern is a rectangular grid, more precisely a quadratic grid. The active antennas 12 and passive antennas 14 are arranged with the same distances between adjacent antennas 12, 14 irrespective whether the adjacent antenna 12, 14 is an active antenna 12 or a passive antenna 14.

The 16 active antennas 12 are arranged in a 4×4 grid in the center of the antenna array 10 forming an inner portion 18 of the antenna array 10. The passive antennas 14 are arranged in a ring-shaped manner completely surrounding the inner portion 18 and forming an outer portion 20. In the shown embodiment, no active antennas 12 are arranged in the outer portion 20 and no passive antennas 14 are arranged in the inner portion 18. Within the inner portion 18, the central 2×2 grid of four active antennas 12 is the center 22 of the inner portion 18, i.e. the section of the inner portion 18 in which all active antennas 12 are adjacent to other actives antennas 12 only. The section of the inner portion 18 between the center 22 and the outer portion 20 forms a periphery 24 of the inner portion 18. In the periphery 24, the active antennas 12 have at least one adjacent passive antenna 14.

In the arrangement shown in FIG. 1 the periphery 24 is a ring of active antennas 12 surrounding the center 22.

Each of the antennas 12, 14 has a defined number of neighboring antennas being the number of neighboring active antennas 12 and passive antennas 14. In the embodiment of FIG. 1, the number of neighboring antennas 12, 14 for a specific antenna 12, 14 is determined by counting the antennas 12, 14 closest and second closest to the antenna 12, 14 in question. Of course, it is also possible to count only the closest antenna; or the closest, second closest and third closest antenna; or the closest, second closest, third closest and fourth closest antennas; and so on.

In a more visual description referring to FIG. 1, all of the lateral and diagonal neighbors of a specific antenna 12, 14 are counted as neighboring antennas 12, 14. Thus, each active antenna 12 of the center 22 of the inner portion 18 has eight neighboring antennas 12, all being active antennas 12. The active antennas 12 being located in the periphery 24 of the inner portion 18 also have eight neighboring antennas 12, 14. However, they have only three or five neighboring active antennas 12.

Because the radiation pattern of each of the active antennas 12 is heavily influenced by the number of neighboring antennas 12, 14, the passive antennas 14 are arranged adjacent to the inner portion 18. This way, the "lack" of neighboring antennas 12, 14 for active antennas 12 in the periphery 24 of the inner portion 18 is compensated by the passive antennas 14 so that each of the active antennas 12 in the periphery 24 has the same number of neighboring antennas 12, 14 as the active antennas 12 located in the center 22 of the inner portion 18.

In effect, the number of neighboring antennas 12, 14 is the same for each active antenna 12 of the antenna array 10.

Due to the rectangular grid in the embodiment of FIG. 1, each of the antennas 12, 14 has the same distance to each of their respective neighboring antennas 12, 14, i.e. to the closest antennas 12, 14 and to the second closest antennas 12, 14.

The fact that active antennas 12 in the periphery 24 of the inner portion 18 have—due to the presence of the passive antennas 14—the same number of neighbors as the active antennas 12 in the center 22 of the inner portion leads to the effect that the radiation pattern of the active antennas 12 in the periphery 24 are altered by the passive antennas 14 to match the radiation patterns of the active antennas 12 in the center 22 of the inner portion 18. Thus, due to the passive antennas 14 surrounding the inner portion 18, all of the active antennas 12 have the same radiation pattern. This property simplifies the calibration of the antenna array 10.

Figure 2:
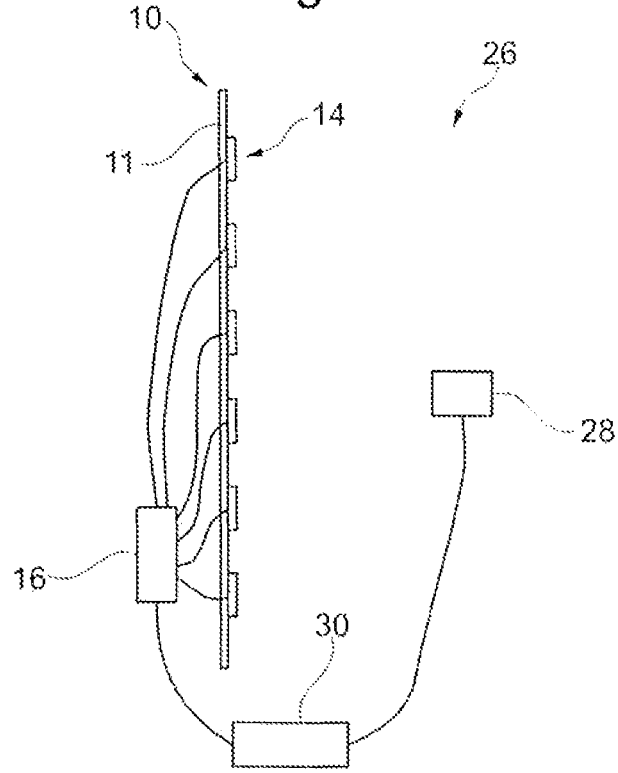
FIG. 2 shows schematically a calibration system (not to scale) of the disclosure with an antenna array according to FIG. 1.

For the calibration of the antenna array 10, a calibration system 26 is shown in FIG. 2 schematically and not to scale. The calibration system 26 comprises the antenna array 10 (shown in a side view), at least a single stationary measurement antenna 28 arranged at a defined distance to the antenna array 10, in particular in the near field, and a calibration unit 30 controlling the calibration system 26. The measurement antenna 28 is connected to the calibration unit 30. The calibration unit 30 is in turn electrically connected to the control unit 16. The calibration unit 30 can control the control unit 16 to perform the calibration. It is also possible that the calibration unit 30 and the control unit 16 are the same device.

The measurement antenna 28 is configured, for example by the calibration unit 30, to receive signals emitted by the active antennas 12 of the antenna array 10. The measurement antenna 28 can also receive signals emitted by a single active antenna 12 of the antenna array 10.

The antenna array 10 is calibrated using the calibration system 26.

In a first step, the radiation pattern of one of the active antennas 12 is determined, at least for the designated angular range used during the operation of the antenna array 10. This may have been done computationally, i.e. by simulating the radiation pattern of one of the active antennas 12 and storing the radiation pattern in a memory of the control unit 16 or of the calibration unit 30. It is also possible that the radiation pattern of one of the active antennas 12 is measured using a moveable measurement antenna and storing the radiation pattern in a memory of the control unit 16 or the calibration unit 30.

Due to the fact that the radiation pattern for all of the active antennas 12 is the same, determining the radiation pattern for one of the active antennas 12 is sufficient to know the radiation pattern of any of the active antennas 12 of the antenna array.

In the next step, one of the active antennas 12 of the antenna array 10 is driven by the control unit 16 to emit a signal. The signal emitted is then picked up by the measurement antenna 28. The other active antennas 12 are not emitting a signal during that time. The control unit 16 controls the other active antennas 12 to be parasitic antennas, namely (controlled) passive antennas.

The signal is then analyzed by the calibration unit 30 with respect to the amplitude and the phase. Because the radiation pattern of the active antenna 12 is known, the calibration unit 30 can determine the difference between the phase and/or amplitude of the measured signal compared to values of phase and amplitude necessary to create a plane wave. Based on the determined difference, the phase and amplitude for this particular active antenna 12 can be adjusted, i.e. calibrated.

After having calibrated one of the active antennas 12, another active antenna 12 is calibrated by emitting a signal. As described before, the other active antennas 12 are turned off. Again, the signal is picked up by the measurement antenna 28 and the phase and the amplitude is adjusted by the calibration unit 30.

This process is repeated for every active antenna 12 of the antenna array 10, and phase weighting is performed so that all phases and amplitudes of the active antennas 12 of the antenna array 10 are in a predefined relationship to each other. This way, the desired total radiation pattern of the antenna array 10 is achieved.

During calibration, the calibration unit 30 may also perform phase weighting calculations.

Thus, calibration of the antenna array 10 has been simplified drastically.

Alternatively, the calibration of the other active antennas 12 is done theoretically without any additional repetition for the other active antennas. The radiation pattern for one of the plurality of the active antennas 12 has been determined as already discussed wherein the relative positions of the antennas 12, 14 with respect to each other, in particular the one of the active antennas 12, are known such that the relative phases and amplitudes of the signals emitted can be determined theoretically based on the aforementioned assumption, in particular calculated.

Figure 3:
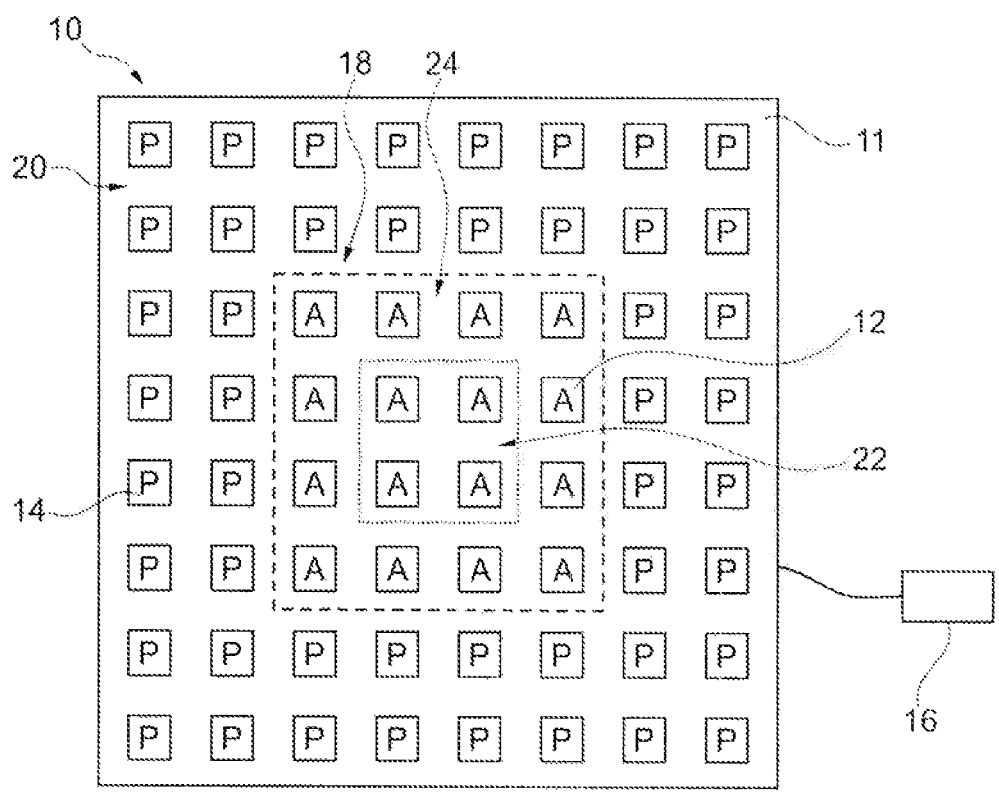
FIG. 3 shows an antenna array according to a second embodiment of the disclosure schematically in a front view.
Figure 4:
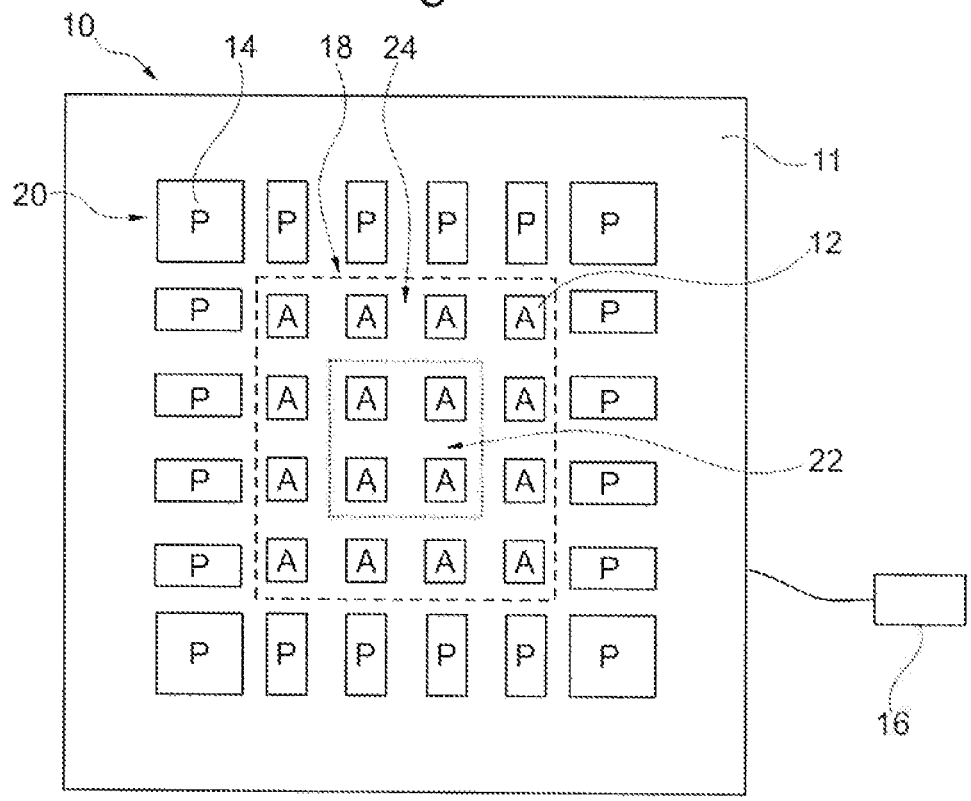
FIG. 4 shows an antenna array according to a third embodiment of the disclosure schematically in a front view.

The embodiments shown in FIGS. 3 and 4 are essentially the same as the embodiment of the antenna array 10 shown in FIG. 1 and calibration of these antenna arrays 10 is performed in the same way. Therefore, in the following only the differences are described and same or like elements are labeled with the same reference number.

The embodiment of FIG. 3 differs from the embodiment of FIG. 1 only in the fact, that more passive antennas 14 are provided. In this embodiment, more than the antennas closest, in particular the second closest, the third closest and/or the fourth closest, to a specific active antenna 12 are regarded as neighboring antennas. Therefore, a second ring of passive antennas 14 is arranged around the first ring of passive antennas 14 in order to provide the same number of neighboring antennas 12, 14 for each of the active antennas 12.

This way, the surrounding area of each of the active antennas 12 in the inner portion 18 that resembles the surrounding area of the other active antennas 12 has been enlarged compared to the first embodiment, leading to radiations pattern with a very high conformity. This, in turn, leads to an improved calibration.

The embodiment of the antenna array 10 shown in FIG. 4 differs from the first embodiment shown in FIG. 1 not in the number of passive antennas 14 but in their size, dimensions and distance to each other and to the active antennas 12. In comparison with the passive antennas 14 of the first embodiment of FIG. 1, the passive antennas 14 of the embodiment of FIG. 4 are elongated radially outwards with respect to the center 22 of the inner portion 18.

Further, the distance between the passive antennas 14 and the active antennas 12 in the periphery 24 of the inner portion 18 is smaller than the distance of the active antennas 12 within the inner portion 18.

Both characteristics, i.e. radially elongation and changed distance, can be used—also separately—to influence the radiation pattern of the active antennas 12 in the periphery 24 of the inner portion 18 to match the radiation pattern of the active antennas 12 of the center 22 of the inner portion 18. For example, the elongation in radial direction has a similar effect as the second ring of passive antennas 14 shown in FIG. 3.

Of course, the dimensions, arrangement and shape of the passive antennas 14 shown in FIG. 4 are only an example of possible changes that can be made to the shape and distance of the passive antennas 14.

The control unit 16 described above may include, in some embodiments, logic to control, for example, the phase and the amplitude of the (electromagnetic) signals emitted by each of the active antennas 12. This logic of the control unit 16 can be carried out in either hardware or software, or a combination of hardware and software. In some embodiments, the control unit 16 includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof. In an embodiment, the control unit 16 includes a microprocessor and a memory storing logic modules and/or instructions. In an embodiment, the control unit 16 includes one or more ASICs having a plurality of predefined logic components. In an embodiment, the control unit 16 includes one or more FPGA having a plurality of programmable logic components.

In an embodiment, the control unit 16 includes hardware circuit implementations (e.g., implementations in analog circuitry, implementations in digital circuitry, and the like, and combinations thereof). In an embodiment, the control unit 16 includes combinations of circuits and computer program products having software or firmware instructions stored on one or more computer readable memories that work together to cause a device to perform one or more methodologies or technologies described herein.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by The embodiments of the invention in which an exclusive property or privilege is claimed are defined as follows:

1. An antenna array comprising:
   a plurality of active antennas and a plurality of passive antennas;
   said plurality of active antennas being arranged in an inner portion of said antenna array, each antenna of said plurality of active antennas having a transmission radiation pattern;
   said passive antennas being arranged such that said transmission radiation patterns of said active antennas located at the periphery of said inner portion are altered by said passive antennas to match said transmission radiation patterns of said active antennas located in the center of said inner portion.

2. The antenna array according to claim 1, wherein said plurality of passive antennas are arranged in an outer portion of said antenna array such that said transmission radiation patterns are the same for each active antenna.

3. The antenna array according to claim 1, wherein said active antennas are electrically connected to a control unit.

4. The antenna array according to claim 3, wherein said control unit controls at least one of the phase and the amplitude of the signals emitted for each of said active antennas individually.

5. The antenna array according to claim 1, wherein said passive antennas are grounded.

6. The antenna array according to claim 1, wherein said passive antennas have a defined impedance.

7. The antenna array according to claim 1, wherein said active antennas are arranged in a regular pattern such that each active antenna has a defined number of neighboring antennas being the number of neighboring active antennas and passive antennas,
   said passive antennas being arranged such that said numbers of neighboring antennas of said active antennas located at the periphery of the inner portion are increased by said passive antennas to match said numbers of neighboring antennas of active antennas located in the center of said inner portion.

8. The antenna array according to claim 1, wherein said plurality of passive antennas are arranged such that said number of neighboring antennas is the same for each active antenna.

9. The antenna array according to claim 1, wherein said active antennas are arranged in a regular pattern such that a distance between one of said active antennas and a neighboring passive antenna is the same as a distance between said one of said active antennas and a neighboring active antenna.

10. The antenna array according to claim 9, wherein said antennas are arranged in a rectangular grid.

11. The antenna array according to claim 9, wherein said regular pattern is defined by antennas being arranged in columns and rows in a front view onto said antenna array.

12. The antenna array according to claim 7, wherein all active antennas have the same number of neighboring antennas and the same distances to each of their respective neighboring antennas.

13. The antenna array according to claim 7, wherein neighboring antennas to one of said plurality of active antennas include one of the antennas closest to said one antenna; the antennas closest and second closest to said one antenna; the antennas closest, second closest, and third closest to said one antenna; and the antennas closest, second closest, third closest, and fourth closest to said one antenna.

14. The antenna array according to claim 1, wherein said passive antennas are arranged in at least one ring around said inner portion.

15. The antenna array according to claim 14, wherein said passive antennas are arranged in at least a first ring and a second ring around said inner portion.

16. The antenna array according to claim 1, wherein said passive antennas are at least one of:
   (i) dimensioned differently with respect to said active antennas; and
   (ii) located at different distances to said active antennas located at the periphery of said inner portion compared to the distances between said active antennas.

17. A calibration system comprising a single stationary measurement antenna and an antenna array according to claim 1, said single stationary measurement antenna configured to receive signals emitted by at least one of said active antennas of said antenna array.

18. A method for calibrating an antenna array according to claim 1 comprising the following steps:
   (a) determining said radiation pattern of one of the plurality of active antennas;
   (b) placing a stationary measurement antenna in front of said antenna array and measuring the signal emitted by a single active antenna driven by a control unit of said antenna array; and
   (c) performing calibration using a signal measured by said measurement antenna and assuming that said radiation pattern of all active antennas of said plurality of active antennas corresponds to said radiation pattern determined in step (b).

19. The method according to claim 18, wherein steps (b) and (c) are repeated for every active antenna of said antenna array.

20. The method according to claim 19, wherein said active antennas are calibrated during step (c) such that a desired radiation pattern of said antenna array is achieved.

* * * * *